US007446555B2

(12) United States Patent
Choi et al.

(10) Patent No.: US 7,446,555 B2
(45) Date of Patent: Nov. 4, 2008

(54) APPARATUS TO INSPECT TFT SUBSTRATE AND METHOD OF INSPECTING TFT SUBSTRATE

(75) Inventors: Chang-hoon Choi, Suwon-si (KR); Hee-soo Pyun, Suwon-si (KR); Hwa-sub Shim, Suwon-si (KR); Ho-seok Choi, Suwon-si (KR); Dong-seok Baek, Suwon-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 7 days.

(21) Appl. No.: 11/478,683

(22) Filed: Jul. 3, 2006

(65) Prior Publication Data

US 2007/0024294 A1 Feb. 1, 2007

(30) Foreign Application Priority Data

Jul. 4, 2005 (KR) ..................... 10-2005-0059853

(51) Int. Cl.
*G01R 31/00* (2006.01)
*G01R 31/305* (2006.01)

(52) U.S. Cl. ...................................... 324/770; 324/751

(58) Field of Classification Search ......... 324/750–765, 324/770
See application file for complete search history.

(56) References Cited

U.S. PATENT DOCUMENTS 5,377,030 A * 12/1994 Suzuki et al. ............... 349/187
5,417,494 A * 5/1995 Kempa et al. .................. 374/5
5,546,013 A * 8/1996 Ichioka et al. ............. 324/770
5,982,190 A * 11/1999 Toro-Lira ................... 324/770
6,033,281 A * 3/2000 Toro-Lira .................... 445/63
6,873,175 B2 * 3/2005 Toro-Lira et al. ........... 324/770
7,106,089 B2 * 9/2006 Nakano et al. ............. 324/770
7,135,875 B2 * 11/2006 Brunner ...................... 324/751
7,157,921 B2 * 1/2007 Shonohara .................. 324/751
7,282,943 B2 * 10/2007 Sakaguchi et al. .......... 324/770
7,295,030 B2 * 11/2007 Imura et al. ................. 324/765
2004/0174182 A1 9/2004 Toro-Lira et al.
2005/0174140 A1 * 8/2005 Iwasaki ...................... 324/770
2006/0176072 A1 * 8/2006 Kim et al. ................... 324/770

* cited by examiner

*Primary Examiner*—Ha T. Nguyen
*Assistant Examiner*—Karen M Kusumakar
(74) *Attorney, Agent, or Firm*—Stanzione & Kim, LLP

(57) ABSTRACT

An apparatus to inspect a TFT substrate including a gate line, a data line crossed with the gate line and insulated from the gate line, a TFT disposed at an intersection of the gate line and the data line, and a pixel electrode connected to the TFT includes a vacuum chamber, a stage disposed in the vacuum chamber and on which the TFT substrate is settled, an electron beam generator disposed over the stage, a gate driving part to apply a gate-on voltage to the gate line to turn on the TFT, a signal detector connected to the data line and to sense an electric signal from the pixel electrode, and a controller to control the gate driving part and the electron beam generator so that a electron beam is irradiated to the pixel electrode while the TFT is turned on.

21 Claims, 7 Drawing Sheets

(a) (b) (c)

APPARATUS TO INSPECT TFT SUBSTRATE AND METHOD OF INSPECTING TFT SUBSTRATE

CROSS-REFERENCE TO RELATED APPLICATIONS

This application claims priority under 35 U.S.C. §119(a) from Korean Patent Application No. 2005-0059853, filed on Jul. 4, 2005, in the Korean Intellectual Property Office, the disclosure of which is incorporated herein by reference in its entirety.

BACKGROUND OF THE INVENTION

1. Field of the Invention

The present general inventive concept relates to an apparatus to inspect a thin film transistor (TFT) substrate and a method of inspecting a TFT substrate, and more particularly, to an apparatus to inspect a TFT substrate and a method of inspecting a TFT substrate that measures an electric signal generated in a pixel electrode via a data line by irradiating the pixel electrode with an electron beam.

2. Description of the Related Art

An example of a flat panel display popularly used in recent years is a liquid crystal display (LCD). The LCD includes a TFT substrate where TFTs of a switching element are formed, a color filter substrate where color filter layers are formed, and a liquid crystal layer formed between both substrates.

The TFT substrate is formed by a multi-step photolithography method, and the TFT substrate is inspected after each step to decide whether the TFT substrate is defective or not. An electron beam is used for inspecting the TFT substrate having a pixel electrode connected to the TFT.

Conventionally, the electron beam is applied to the pixel electrode while a certain voltage is applied to the pixel electrode. For example, the electron beam is applied to the pixel electrode while a voltage of 5V is applied to the pixel electrode, and the degree of a secondary electron beam from the pixel electrode is measured. When the degree of the secondary electron beam from the pixel electrode is less than a predetermined value means, the pixel electrode is applied with less than 5V, and thus the TFT can be decided to be defective.

However, the conventional method needs an additional detector to measure the secondary electron beam from the pixel electrode and a configuration to apply the voltage to the pixel electrode becomes complex.

SUMMARY OF THE INVENTION

The present general inventive concept provides an apparatus to inspect a TFT substrate having a simple configuration to detect whether the TFT substrate is defective or not.

The present general inventive concept also provides a method of inspecting a TFT substrate having a simple configuration to detect whether the TFT substrate is defective or not.

Additional aspects and advantages of the present general inventive concept will be set forth in part in the description which follows and, in part, will be obvious from the description, or may be learned by practice of the general inventive concept.

The foregoing and/or other aspects and utilities of the present general inventive concept may be achieved by providing an apparatus to inspect a thin film transistor substrate comprising a gate line, a data line crossed with the gate line and insulated from the gate line, a thin film transistor disposed at an intersection of the gate line and the data line, and a pixel electrode connected to the thin film transistor, the apparatus comprising a vacuum chamber, a stage disposed in the vacuum chamber and on which the thin film transistor substrate is settled, an electron beam generator disposed over the stage, a gate driving part to apply a gate-on voltage to the gate line to turn on the thin film transistor, a signal detector connected to the data line to sense an electric signal from the pixel electrode, and a controller to control the gate driving part and the electron beam generator so that a electron beam is irradiated to the pixel electrode while the thin film transistor is turned on.

The apparatus may further comprise an X-Y driving part to drive the stage two dimensionally.

The signal detector may comprise a current amplifier to amplify a current from the pixel electrode and a voltage/current converter to convert the amplified current into a voltage.

A data pad may be located at the end portion of the data line and the signal detector is connected to the data pad.

The electron beam generator may comprise an electron gun to generate an electron beam and a deflector to control an irradiating direction of the electron beam by applying an electric field to the electron beam.

The electron beam generator can be provided in plural.

The controller may control the gate driving part so as to apply the gate-on voltage to the gate line sequentially and repeatedly.

The vacuum chamber may have a degree of vacuum of about $10^{-7}$ Torr or less.

The apparatus may further comprise a defect detector connected to the signal detector to determine whether the thin film transistor is defective.

The foregoing and/or other aspects and utilities of the present general inventive concept may also be achieved by providing a method of inspecting a thin film transistor substrate comprising a gate line, a data line crossed with the gate line and insulated from the gate line, a thin film transistor disposed at an intersection of the gate line and the data line, and a pixel electrode connected to the thin film transistor, the method including, disposing the thin film transistor substrate in a vacuum chamber and generating a vacuum in the vacuum chamber, applying a gate-on voltage to the gate line to turn on the thin film transistor, irradiating an electron beam to the pixel electrode while the thin film transistor is turned on, and detecting an electric signal from the data line connected to the pixel electrode when the pixel electrode is irradiated with the electron beam.

The detecting of the electric signal may comprise amplifying a current from the pixel electrode and converting the amplified current into a voltage.

The method may further comprise determining that the TFT is defective when the voltage is less than a predetermined value.

The method may further comprise irradiating the electron beam to a plurality of pixel electrodes of the thin film transistor substrate at the same time.

The method may further comprise applying the gate-on voltage to the gate line sequentially and repeatedly.

The vacuum chamber may have a degree of vacuum of about $10^{-7}$ Torr or less while irradiating the electron beam.

The foregoing and/or other aspects and utilities of the present general inventive concept may also be achieved by providing an apparatus to inspect a thin film transistor substrate having a gate line, a data line crossed with the gate line and insulated from the gate line, a thin film transistor disposed at an intersection of the gate line and the data line, and a pixel electrode connected to the thin film transistor, the apparatus including a gate driving unit to turn on the thin film transistor, an electron beam generating unit to generate an electron beam and to transmit the electron beam to the pixel electrode, a signal detecting unit to receive a current from the pixel electrode using the electron beam, and a controller to determine whether the thin film transistor is defective according to the current.

The signal detecting unit may include a converting unit to convert the current from the pixel electrode into a voltage, and the signal detecting unit may determine whether the thin film transistor is defective by comparing a value of the converted voltage to a predetermined voltage value. The signal detecting unit may further include an amplifying unit to amplify the current from the pixel electrode before the current is converted into the voltage. The electron beam generating unit may include a deflecting unit to deflect the electron beam to one or more locations on the thin film transistor substrate within a distance of about 12 cm. The deflecting unit may include a plurality of plates across which varying polarities can be introduced. The gate driving unit may turn on the thin film transistor by transmitting a turn-on signal through the gate line, and the signal detecting unit may receive the current from the pixel electrode through the data line.

The foregoing and/or other aspects and utilities of the present general inventive concept may also be achieved by providing a method of inspecting a thin film transistor substrate having a gate line, a data line crossed with the gate line and insulated from the gate line, a thin film transistor disposed at an intersection of the gate line and the data line, and a pixel electrode connected to the thin film transistor, the method including turning on the thin film transistor, transmitting an electron beam to the pixel electrode, and receiving a current from the pixel electrode.

The method may further include determining whether the thin film transistor is defective by comparing a value of the current from the pixel electrode to a predetermined current value. The method may further include converting the current from the pixel electrode into a voltage, and determining whether the thin film transistor is defective by comparing a value of the converted voltage to a predetermined voltage value. The method may further include amplifying the current from the pixel electrode before converting the current into the voltage. The method may further include deflecting the electron beam to one or more locations on the thin film transistor substrate within a distance of about 12 cm using optical properties of the electron beam. The turning on of the thin film transistor may include transmitting a turn-on signal through the gate line, and the receiving of the current from the pixel electrode may include receiving the current from the pixel electrode through the data line.

BRIEF DESCRIPTION OF THE DRAWINGS

The above and/or other aspects and advantages of the present general inventive concept will become apparent and more readily appreciated from the following description of the embodiments, taken in conjunction with the accompany drawings of which.

DETAILED DESCRIPTION OF THE PREFERRED EMBODIMENTS

Figure 1:
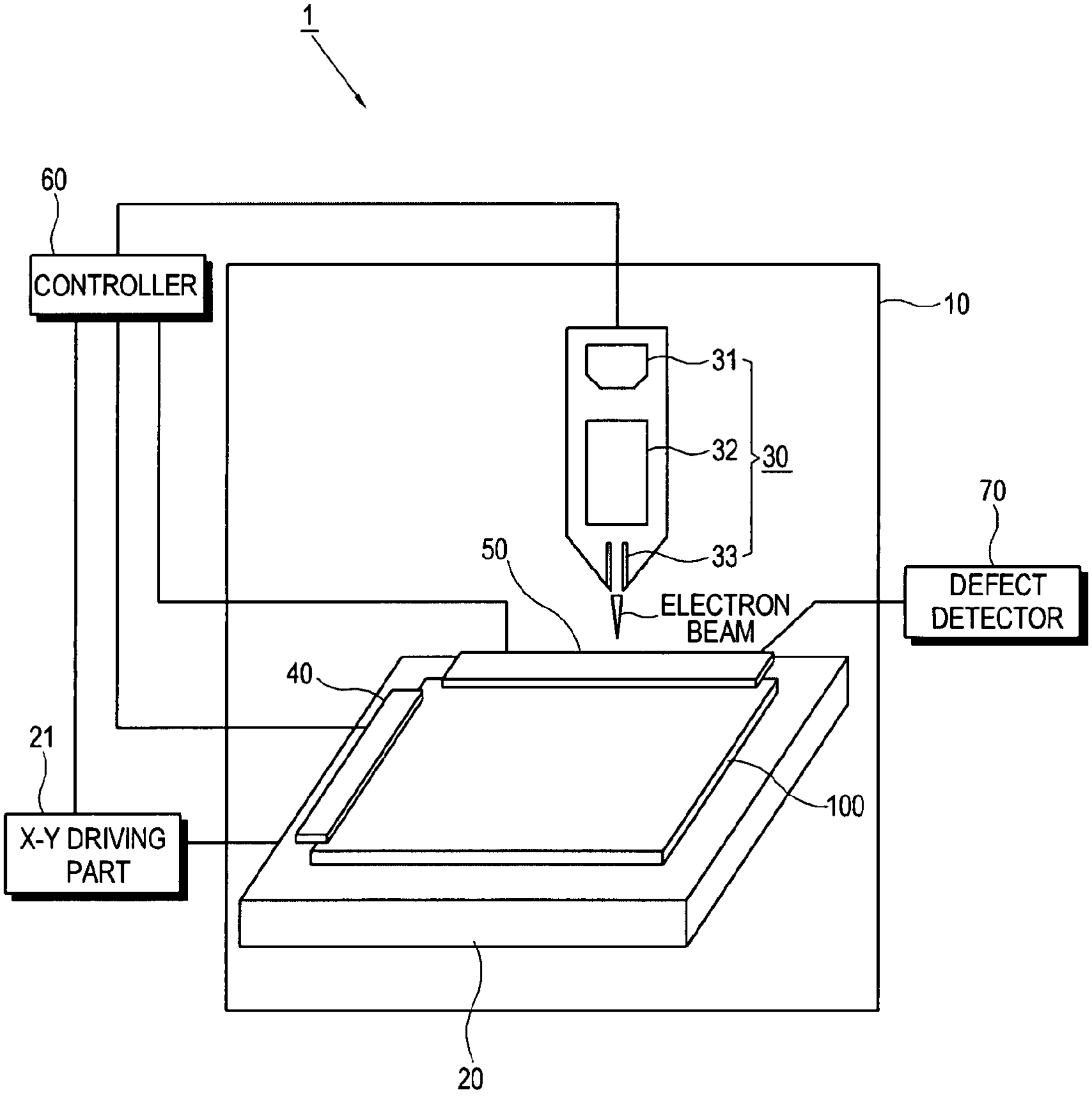
FIG. 1 is a configuration view illustrating an apparatus to inspect a TFT substrate according to an embodiment of the present general inventive concept.

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

FIG. 1 is a configuration view illustrating an apparatus 1 to inspect a TFT substrate 1 according to an embodiment of the present general inventive concept.

The apparatus 1 to inspect a TFT substrate 100 may include a vacuum chamber 10 to form a vacuum, a stage 20 disposed in a lower part of the vacuum chamber 10 to support the TFT substrate 100 (which is an object of inspection), an electron beam generator 30 disposed over the stage 20 to irradiate an electron beam to the TFT substrate 100, a gate driving part 40 connected to a side of the TFT substrate 100, a signal detector 50 connected to another side of the TFT substrate 100, a controller 60 to control the electron beam generator 30 and the gate driving part 40, and a defect detector 70 connected to the signal detector 50 to detect whether the TFT substrate 100 is defective or not.

The vacuum chamber 10 may accomodate the stage 20, the electron beam generator 30, the gate driving part 40, and/or the signal detector 50. The vacuum chamber 10 can maintain a vacuum at $10^{-7}$ Torr or less so that electron beam is efficiently irradiated from the electron beam generator 30. Thus, the vacuum chamber 10 may be connected to a vacuum pump (not illustrated). Although FIG. 1 illustrates that the vacuum chamber 10 contains each of the stage 20, the electron beam generator 30, the gate driving part 40, and the signal detector 50 therein, at least one of the electron beam generator 30, the gate driving part 40, and the signal detector 50 may be disposed outside the vacuum chamber 10.

The TFT substrate 100 can be settled on the stage 20, and the stage 20 can be wider than the TFT substrate 100. The stage 20 can be connected to an X-Y driving part 21 to move the stage 20 two-dimensionally. The X-Y driving part 21 can be controlled by the controller 60 to move the stage 20 two-dimensionally.

Figure 2:
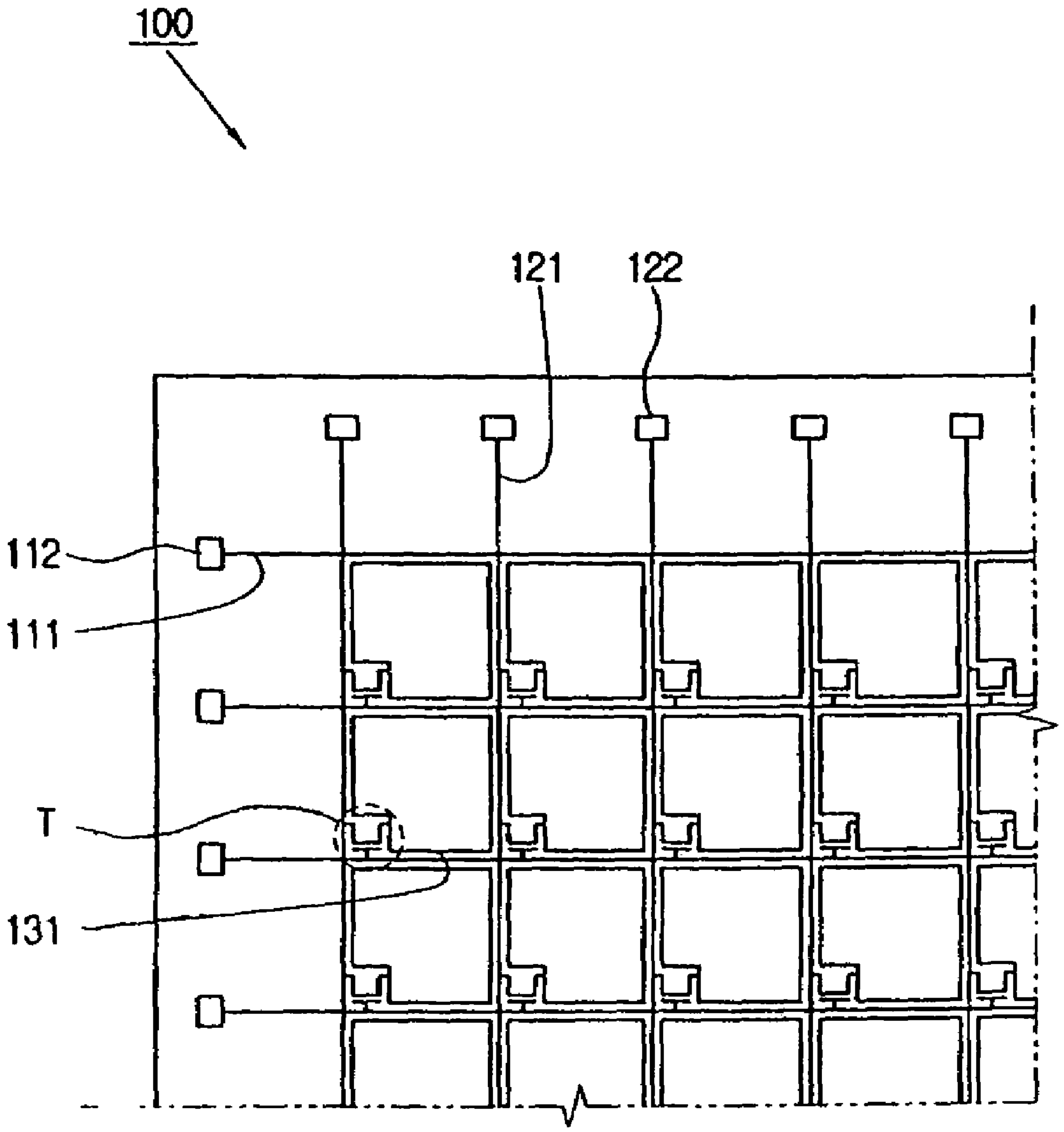
FIG. 2 is an arrangement view illustrating the TFT substrate of FIG. 1.

Referring to FIGS. 1 and 2, the TFT substrate 100, which is an object of inspection, will be described.

A gate line 111 and a data line 121 are crossly formed on the TFT substrate 100, which are insulated from each other. For example, the gate line 111 may be formed in a first direction, and the data line 121 may be formed in a second direction that may be perpendicular to the first direction, such that the gate line 111 and the data line 121 intersect. Agate pad 112 may be formed at an end of the gate line 111 to receive an external signal and a data pad 122 may be formed at an end of the data line 121 to receive an external signal. The gate pad 112 and the data pad 122 can be wider than the gate line 111 and the data line 121, respectively.

A TFT T may be disposed at the intersection of the gate line 111 and the data line 121 and may be connected to a pixel electrode 131. The TFT T may include a semiconductor layer made of amorphous silicon or poly silicon. The pixel electrode 131 may be made of indium tin oxide (ITO) or indium zinc oxide (IZO). The TFT T is turned on when a gate-on voltage is applied to the gate line 111. When the TFT T is turned on, the TFT T transmits a data voltage from the data line 121 to the pixel electrode 131.

Using a conventional apparatus to inspect the TFT T, when the TFT T is defective, the data voltage from the data line 121 is not properly transmitted to the pixel electrode 131, and the defective TFT T is detected by comparing a value of a secondary electron beam from the pixel electrode 131 to a predetermined electron beam value. In contrast to the conventional apparatus, using an apparatus according to an embodiment of the present general inventive concept, if the TFT T is defective, an electrical signal from the pixel electrode 131 is not properly transmitted to the data line 121, and the defective TFT T is detected by comparing a value of the electrical signal from the pixel electrode 131 to a predetermined electrical signal value.

Referring back to FIG. 1, the electron beam generator 30 is disposed over the stage 20. The electron beam generator 30 includes an electron gun 31 to generate an electron beam, an optical instrument 32 to change an optical property of the electron beam generated by the electron gun 31, and a deflector 33 to control a direction of the electron beam when the electron beam is irradiated onto the TFT substrate 100.

Figure 3:
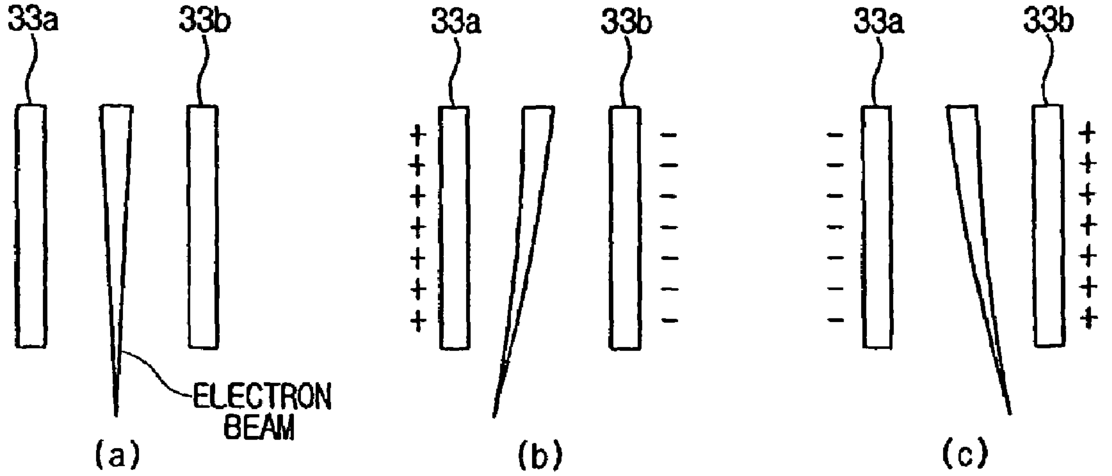
FIG. 3 is a view illustrating a deflector of FIG. 1.

Referring to FIG. 3, it will be described how the deflector 33 functions. The deflector 33 may comprise a pair of plates 33*a* and 33*b*, which are opposite to each other. When both plates 33*a* and 33*b* are not polarized, the electron beam proceeds straight between the plates 33*a* and 33*b*, as illustrated in a first example (a) of the deflector 33. However, when both plates 33*a* and 33*b* are polarized with different polarities, as illustrated in second and third examples (b) and (c) of the deflector 33, the electron beam proceeds toward the plate having a positive polarity. With this property of the electron beam, the electron beam may be irradiated to different positions of the TFT substrate 100, though the stage 20 is fixed. However, the deflector 33 can move the electron beam on the TFT substrate 100 by a distance of about 12 cm.

Referring to FIGS. 1 and 2, the gate pad 112 of the TFT substrate 100 can be connected to the gate driving part 40. The gate driving part 40 can apply the gate-on voltage to the gate pad 112. Then, the gate-on voltage is transmitted to the gate line 111 to turn on the TFT T, which is connected to the gate line 111. The gate driving part 40 can apply the gate-on voltage to every gate pad 112 at the same time. In addition, the gate driving part 40 can apply the gate-on voltage to each gate pad 112 sequentially and/or repeatedly.

The data pad 122 of the TFT substrate 100 can be connected to the signal detector 50. When the electron beam is irradiated to the pixel electrode 131, a current is formed in the pixel electrode 131. Then, the current is transmitted to the data line 121 through the TFT T, which is on. The signal detector 50 can be connected to the data pad 122 to detect the current from the pixel electrode 131.

Figure 4:
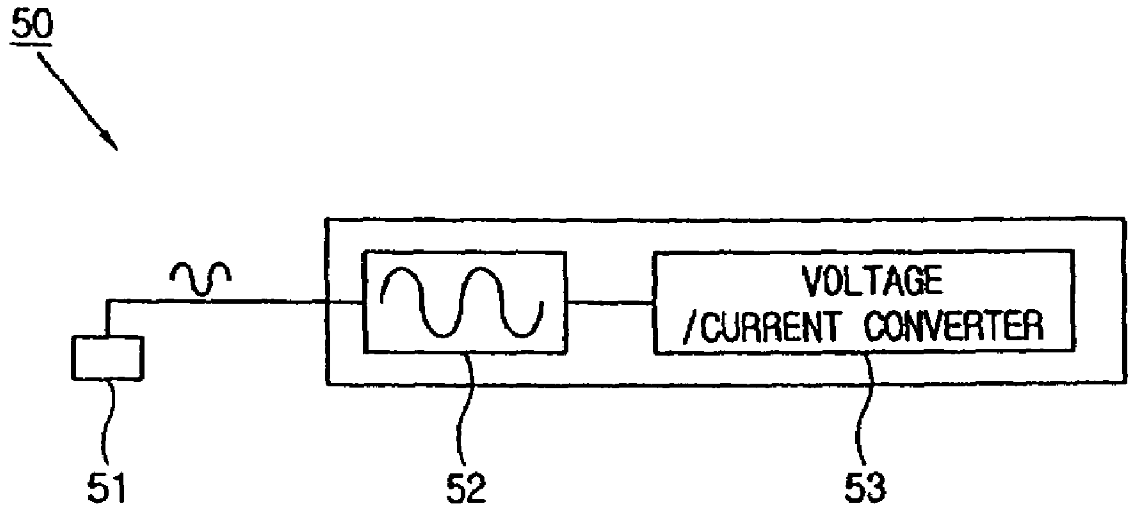
FIG. 4 is a view illustrating a signal detector of FIG. 1.

Referring to FIG. 4, the signal detector 50 can include a data pad connector 51 connected to the data pad 122, a current amplifier 52 to amplify the current transmitted from the data pad connector 51, and a voltage/current converter 53 to convert the amplified current into a voltage.

The data pad connector 51 may be independently connected to each of the data pads 122. The current formed by the electron beam in the pixel electrode 131 may be expressed in, for example, pA. The current amplifier 52 amplifies the current from pA to μA. Response time is slow when the current is measured, and may be enhanced by converting the current into the voltage. The voltage/current converter 53 converts the amplified current into the voltage.

The gate driving part 40 and the signal detector 50 can be provided to process any size of the TFT substrate 100. Further, the gate pad 112 and/or the data pad 122 may not be included in the apparatus 1 depending on the TFT substrate 100, or the gate driving part 40 and the signal detector 50 may be modified according to the TFT substrate 100.

The controller 60 can control the gate driving part 40 and the electron beam generator 30 so that the electron beam is irradiated to the pixel electrode 131 connected to the TFT T, which is on. Also, the controller 60 can control the X-Y driving part 21 to move the stage 20 so as to inspect the whole TFT substrate 100.

The defect detector 70 decides whether the TFT T is defective or not using electric signals (e.g., the current or the converted voltage value) from each of pixel electrodes 131 detected by the signal detector 50. When the converted voltage value is used, the TFT T is decided to be defective if the voltage value is less than a predetermined value. The amounts of current generated in each of pixel electrodes 131 by the electron beam are similar. However, the current generated in the pixel electrode 131 is not transmitted normally when the TFT T is defective, thus the defective TFT can be detected. The defect detector 70 can be connected to the controller 60 to decide where the defective TFT T is located.

The apparatus to inspect the TFT substrate 1 according to an exemplary embodiment of the present general inventive concept does not need a secondary electron detector, because the current transmitted from the pixel electrode 131 through the data line 121 due to the irradiation of the pixel electrode 131 by the electron beam is detected, as opposed to detecting a secondary electron beam from the pixel electrode. Further, the apparatus 1 does not need to apply a pixel voltage to the pixel electrode 131 through the data line 121. Accordingly, the apparatus to inspect the TFT substrate 1 becomes simplified in its configuration and is reduced in size.

The apparatus to inspect the TFT substrate 1 may be modified variously. For example, the electron beam generator 30 may be provided as a plurality of electron beam generators 30 to irradiate the electron beam to a plurality of the pixel electrodes 131 of the TFT substrate 100 simultaneously. The electron beam generator 30 can be fixed, or it may be moved using an additional driving part.

Hereinafter, a method of inspecting a TFT substrate 100 according to an exemplary embodiment of the present general inventive concept will be described as referring to FIGS. 1, 2, and 5.

First, the TFT substrate 100 is can be provided in the vacuum chamber 10, at operation S100. The TFT substrate 100 is settled in the stage 20. The gate pad 112 of the TFT substrate 100 is connected to the gate driving part 40 and the data pad 122 thereof is connected to the signal detector 50.

Next, the vacuum chamber 10 is adjusted at $10^{-7}$ Torr or less, at operation S200.

Thereafter, the TFT T is turned on at operation S300. The gate driving part 40 applies the gate-on voltage to the TFT T through the gate pad 122 to turn the TFT T on.

Then, the electron beam is irradiated to the pixel electrode 131 connected to the TFT T, which is on, at operation S400. The current is generated in the pixel electrode 131 by the irradiation of the electron beam, and the current is transmitted to the data line 121 through the TFT T, which is on.

Figure 6:
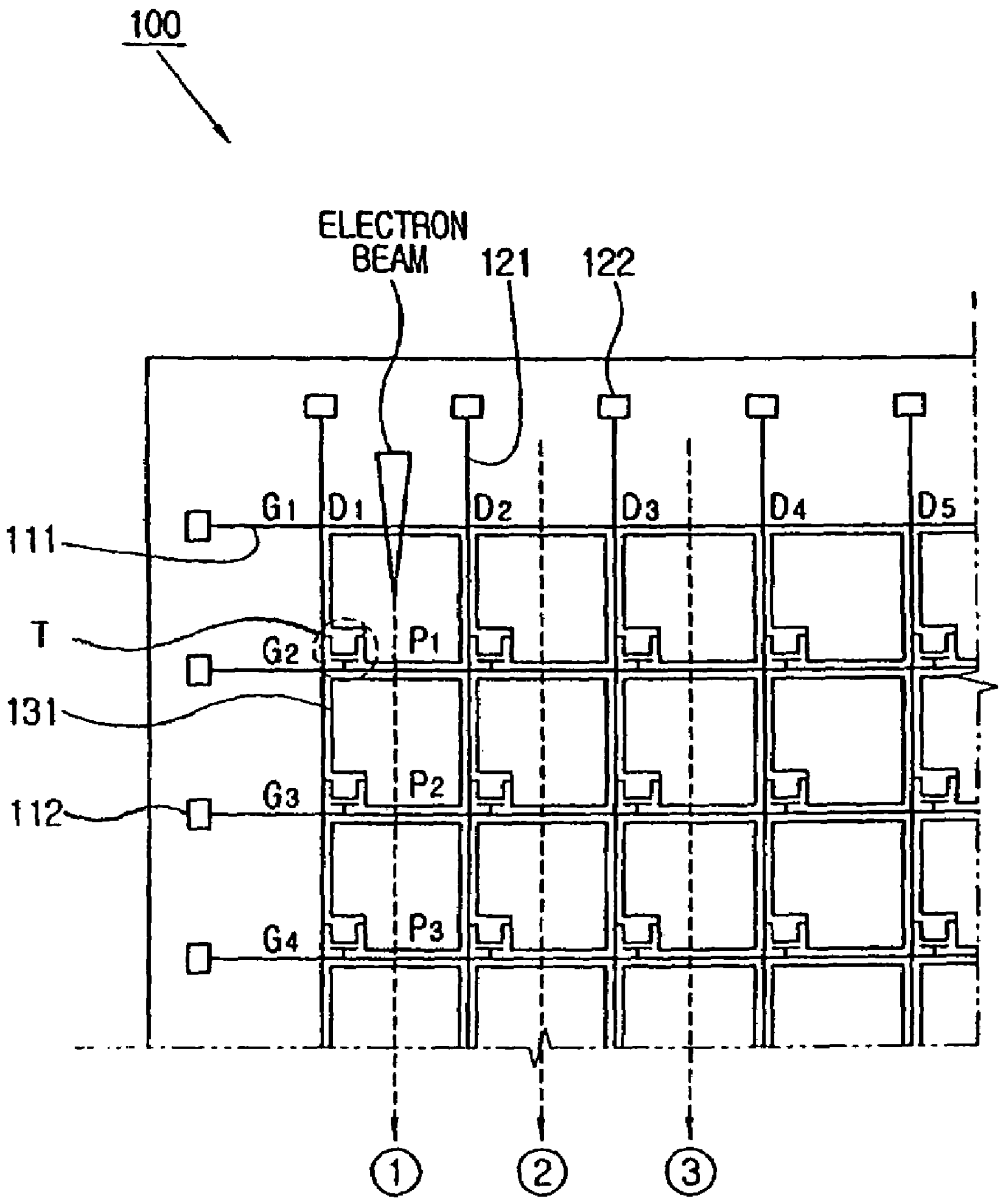
FIG. 6 is a view illustrating the TFT substrate of the method of FIG. 5.

Referring to FIG. 6, it will be described how the TFT T is turned on and the electron beam is irradiated to the pixel electrode 131.

The gate-on voltage is sequentially applied along the gate line 111 from an upper portion of the TFT substrate 100 (i.e., a portion closest to the data pad 122) to a lower portion of the TFT substrate 100 (i.e., a portion farthest from the data pad 122). The gate-on voltage applied to a gate line G1 turns on all the TFTs T connected to the gate line G1. Then, the electron beam is irradiated to a pixel electrode P1 connected to the data line D1. After the irradiation of the electron beam for a predetermined time, the gate-on voltage is applied to a next gate line G2, and the electron beam is irradiated to a pixel electrode P2 connected to the data line D1.

The aforementioned process is repeated to irradiated the electron beam to all of the pixel electrodes 131 connected to the data line D1, and then the process is repeated to the pixel electrodes 131 connected to a next data line D2. Accordingly, all of the TFTs T of the TFT substrate 100 may be inspected. In this process, the TFT substrate 100 changes an irradiating position of the electron beam while moving two-dimensionally through the X-Y driving part 21. The irradiating position of the electron beam may also be changed using the deflector 33 of the electron beam generator 30.

The turning on of the TFT T and the irradiation of the electron beam to the pixel electrode 131 are not limited to the exemplary embodiment illustrated in FIG. 6. For example, the electron beam may be irradiated to a specific pixel electrode 131 while the gate-on voltage is applied to a plurality of gate lines 111. In this case, the current is not generated by a pixel electrode 131 to which the electron beam is not irradiated, although the TFT T of that pixel electrode 131 is on. The electron beam may be irradiated to a plurality of pixel electrodes 131 that are adjacent in the direction of the gate line 111 at the same time. In this case, the electric signal is detected separately by each of data lines 121 for each of the adjacent pixel electrodes 131. Although the electron beam moves along the direction of the data line 121 in FIG. 6, it may move along the direction of the gate line 111.

Figure 5:
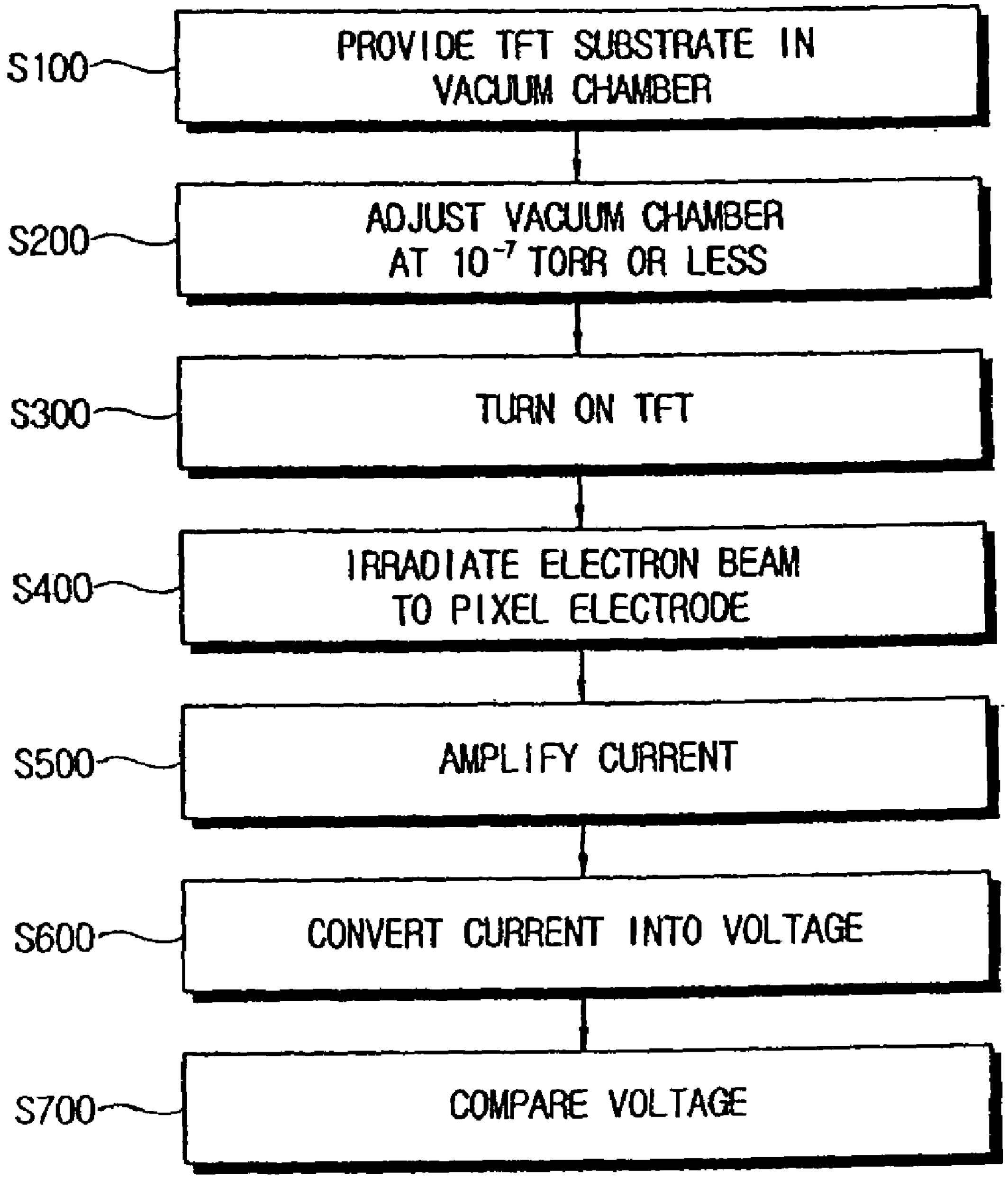
FIG. 5 is a flow chart illustrating a method of inspecting a TFT substrate according to an embodiment of the present general inventive concept.

After the electron beam is irradiated to the pixel electrode 131, the current transmitted through the data line 121 from the irradiated pixel electrode 131 is amplified at operation S500 (see FIG. 5). The current is amplified in the current amplifier 52 of the signal detector 50 from pA to μA, for example. The amplified current is converted into a voltage by the voltage/current converter 53 of the signal detector 50 at operation S600 to enhance a response time of the electric signal.

Figure 7:
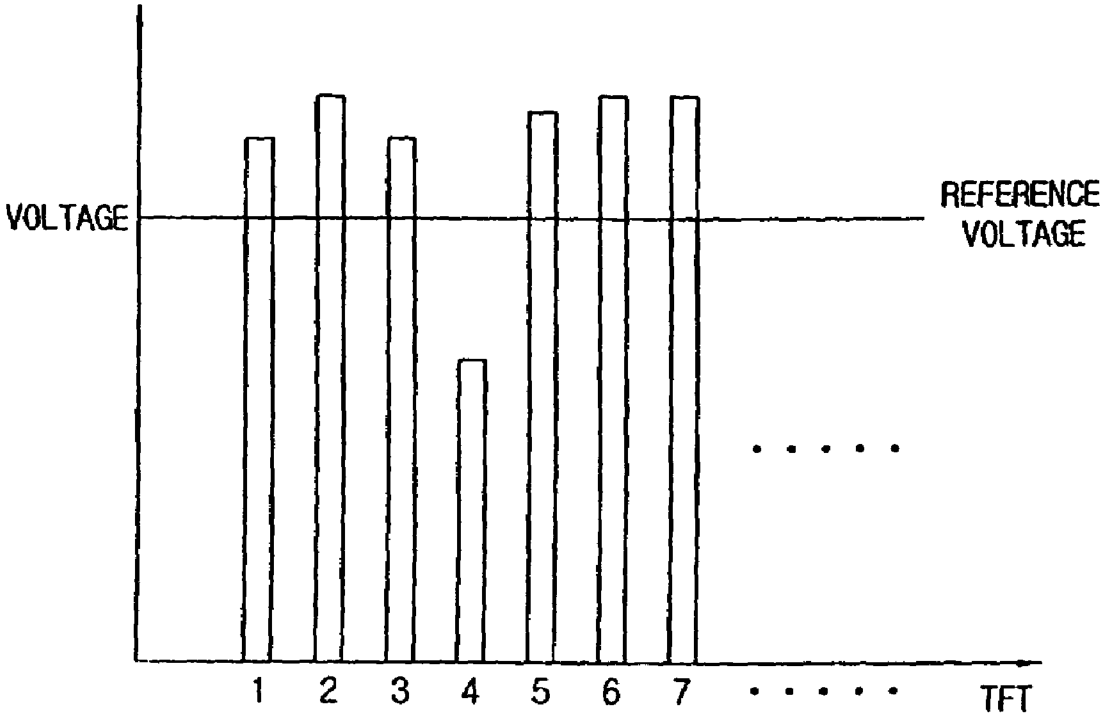
FIG. 7 is a view illustrating an operation of determining whether a TFT is defective or not in the method of FIG. 5.

Finally, the defect detector 70 decides whether the TFT T is defective or not based on the converted voltage at operation S700. Voltage values are obtained from each of the TFTs T, as illustrated in FIG. 7. The defect detector 70 has a predetermined reference voltage value to decide whether the TFT T is defective or not. Accordingly, the TFT T of a pixel electrode 131 transmitting a lower voltage value than the reference voltage value is regarded as a defective. The reference voltage value may be varied depending on an intensity of the electron beam, an irradiating time of the electron beam, a degree of amplifying the current, or the like. A defective TFT can be displayed along with its position on the TFT substrate 100, as illustrated in FIG. 7, and may be repaired by a laser or the like.

The TFT substrate can be used in a display apparatus, such as an LCD or an organic light emitting diode (OLED). The OLED is a self-emitting element using an organic material to emit light when an electric signal is applied to the OLED. A cathode layer (pixel electrode), a hole-injecting layer, a hole transport layer, a light-emitting layer, an electron transport layer, an electron-injecting layer, and an anode layer (counter electrode) can be laminated in the OLED.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An apparatus to inspect a thin film transistor substrate comprising a gate line, a data line crossed with the gate line and insulated from the gate line, a thin film transistor disposed at an intersection of the gate line and the data line, and a pixel electrode connected to the thin film transistor, the apparatus comprising:

a vacuum chamber;

a stage disposed in the vacuum chamber and on which the thin film transistor substrate is settled;

an electron beam generator disposed over the stage;

a gate driving part to apply a gate-on voltage to the gate line to turn on the thin film transistor;

a signal detector connected to the data line to sense an electric signal from the pixel electrode; and a controller to control the gate driving part and the electron beam generator so that a electron beam is irradiated to the pixel electrode while the thin film transistor is turned on.

2. The apparatus according to claim 1, further comprising:

an X-Y driving part to drive the stage two dimensionally.

3. The apparatus according to claim 1, wherein the signal detector comprises:

a current amplifier to amplify a current from the pixel electrode; and a voltage/current converter to convert the amplified current into a voltage.

4. The apparatus according to claim 1, further comprising:

a data pad located at the end portion of the data line and the signal detector is connected to the data pad.

5. The apparatus according to claim 1, wherein the electron beam generator comprises:

an electron gun to generate an electron beam; and a deflector to control an irradiating direction of the electron beam by applying an electric field to the electron beam.

6. The apparatus according to claim 1, wherein the electron beam generator is provided in plural.

7. The apparatus according to claim 1, wherein the controller controls the gate driving part so as to apply the gate-on voltage to the gate line sequentially and repeatedly.

8. The apparatus according to claim 1, wherein the vacuum chamber has a degree of vacuum of about $10^{-7}$Torr or less.

9. The apparatus according to claim 1, further comprising:

a defect detector connected to the signal detector to determine whether the thin film transistor is defective.

10. A method of inspecting a thin film transistor substrate comprising a gate line, a data line crossed with the gate line and insulated from the gate line, a thin film transistor disposed at an intersection of the gate line and the data line, and a pixel electrode connected to the thin film transistor, the method comprising:

disposing the thin film transistor substrate in a vacuum chamber and generating a vacuum in the vacuum chamber;

applying a gate-on voltage to the gate line to turn on the thin film transistor;

irradiating an electron beam to the pixel electrode while the thin film transistor is turned on; and detecting an electric signal from the data line connected to the pixel electrode when the pixel electrode is irradiated with the electron beam.

11. The method according to claim 10, wherein the detecting of the electric signal comprises:

amplifying a current from the pixel electrode and converting the amplified current into a voltage.

12. The method according to claim 11, further comprising:

determining that the thin film transistor is defective when the voltage is less than a predetermined value.

13. The method according to claim 10, further comprising:

irradiating the electron beam to a plurality of pixel electrodes of the thin film transistor substrate at the same time.

14. The method according to claim 10, further comprising:

applying the gate-on voltage to the gate line sequentially and repeatedly.

15. The method according to claim 10, wherein the vacuum chamber has a degree of vacuum of about $10^{-7}$ Torr or less while irradiating the electron beam.

16. An apparatus to inspect a thin film transistor substrate having a gate line, a data line crossed with the gate line and insulated from the gate line, a thin film transistor disposed at an intersection of the gate line and the data line, and a pixel electrode connected to the thin film transistor, the apparatus comprising:

a gate driving unit to turn on the thin film transistor;

an electron beam generating unit to generate an electron beam and to transmit the electron beam to the pixel electrode to form a current in the pixel electrode;

a signal detecting unit connected to the data line to receive the current from the pixel electrode; and a controller to determine whether the thin film transistor is defective according to the current.

17. The apparatus according to claim 16, wherein the signal detecting unit comprises:

a converting unit to convert the current from the pixel electrode into a voltage, wherein the controller determines whether the thin film transistor is defective by comparing a value of the converted voltage to a predetermined voltage value.

18. The apparatus according to claim 17, wherein the signal detecting unit further comprises:

an amplifying unit to amplify the current from the pixel electrode before the current is converted into the voltage.

19. The apparatus according to claim 16, wherein the electron beam generating unit comprises:

a deflecting unit to deflect the electron beam to one or more locations on the thin film transistor substrate within a distance of about 12 cm.

20. The apparatus according to claim 19, wherein the deflecting unit comprises:

a plurality of plates across which varying polarities can be introduced.

21. The apparatus according to claim 16, wherein:

the gate driving unit turns on the thin film transistor by transmitting a turn-on signal through the gate line; and the signal detecting unit receives the current from the pixel electrode through the data line.

* * * * *